United States Patent
Goshonoo (10) Patent No.: US 11,764,329 B2
(45) Date of Patent: Sep. 19, 2023

(54) LIGHT EMITTING DEVICE

(71) Applicant: TOYODA GOSEI CO., LTD., Kiyosu (JP)

(72) Inventor: Koichi Goshonoo, Kiyosu (JP)

(73) Assignee: TOYODA GOSEI CO., LTD., Kiyosu (JP)

( * ) Notice: Subject to any disclaimer, the term of this patent is extended or adjusted under 35 U.S.C. 154(b) by 362 days.

(21) Appl. No.: 17/172,169

(22) Filed: Feb. 10, 2021

(65) Prior Publication Data

US 2021/0305457 A1 Sep. 30, 2021

(30) Foreign Application Priority Data

Mar. 26, 2020 (JP) ................................. 2020-055744

(51) Int. Cl.
| | |
|---|---|
| H01L 33/38 | (2010.01) |
| H01L 33/54 | (2010.01) |
| H01L 33/42 | (2010.01) |
| H01L 33/62 | (2010.01) |
| H01L 27/15 | (2006.01) |

(52) U.S. Cl.
CPC .......... *H01L 33/382* (2013.01); *H01L 27/156* (2013.01); *H01L 33/42* (2013.01); *H01L 33/54* (2013.01); *H01L 33/62* (2013.01)

(58) Field of Classification Search
CPC . H01L 27/15–156; H01L 25/075–0756; H01L 33/36–46
See application file for complete search history.

(56) References Cited

U.S. PATENT DOCUMENTS

| | | | |
|---|---|---|---|
| 2008/0272712 A1 | 11/2008 | Jalink et al. | |
| 2013/0270514 A1* | 10/2013 | Saxler | ..................... H01L 33/08 |
| | | | 257/E29.105 |
| 2022/0285593 A1* | 9/2022 | Goshonoo | ............. H01L 33/145 |

FOREIGN PATENT DOCUMENTS

| | | | |
|---|---|---|---|
| JP | S57-72235 A | 5/1982 | |
| JP | H8-97505 A | 4/1996 | |
| JP | 2009-509326 A | 3/2009 | |
| JP | 2010-177460 A | 8/2010 | |

(Continued)

OTHER PUBLICATIONS

Japanese Office Action, dated Nov. 1, 2022, in Japanese Application No. 2020-055744 and English Translation thereof.

*Primary Examiner* — Mariceli Santiago
(74) *Attorney, Agent, or Firm* — McGinn I.P. Law Group, PLLC (57) ABSTRACT

A light emitting device includes plural light emitting elements arranged on a substrate in lines and individually emit light each other. The light emitting device includes a single continuous n-type semiconductor layer on the substrate shared by the plural light emitting elements, a single continuous light emitting layer on the n-type semiconductor layer shared by the plural light emitting elements, a single continuous p-type semiconductor layer on the light emitting layer shared by the plural light emitting elements, a single continuous contact electrode film on the p-type semiconductor layer shared by the plural light emitting elements, and plural p-side bonding electrodes on the contact electrode film respectively used for the plural light emitting elements. The contact electrode film and the p-type semiconductor layer are configured so as to control current diffusion in in-plane directions thereof.

2 Claims, 6 Drawing Sheets

(56) References Cited

FOREIGN PATENT DOCUMENTS

JP 2014-175338 A 9/2014
KR 20110132160 A * 12/2011

* cited by examiner

LIGHT EMITTING DEVICE

CROSS-REFERENCE TO RELATED APPLICATIONS

The present application is based on Japanese patent application No. 2020-055744 filed on Mar. 26, 2020, the entire contents of which are incorporated herein by reference.

TECHNICAL FIELD

The present invention relates to a light emitting device.

BACKGROUND ART

A light emitting device with plural segments individually emitting light is known which is provided with a n-type layer, a p-type layer, and an active layer intermediated between the p-type layer and the n-type layer that are respectively formed of single continuous film and shared by the plurality of segments, and a plurality of electrodes provided on the p-type layer and used for each of the plurality of segments (see e.g., JP 2009/509326 A).

According to JP 2009/509326 A, the light emitting element hardly occupies space. Although there is no suggestion in JP 2009/509326 A, sharing the n-type layer, p-type layer, and the active layer in the plurality of segments contributes to reduce the space occupied by the light emitting device.

SUMMARY OF INVENTION

Although there is no suggestion according to a forming process of electrode on the p-type layer in JP 2009/509326 A, it is presumed that processing without using dry etching such as wet etching and lift-off processing is used since the p-type layer is reduced by over-etching in patterning by dry etching.

However, it is difficult to shorten a distance between electrodes since wet etching and lift-off processing cannot form fine patterns as with dry etching and thus it is difficult to narrow the pitch of segment. In particular, according to the little emitting device used for a light source of high-resolution display, the distance between the electrodes has high infection for the pitch of segments.

It is an object of the invention to provide a light emitting device that has plural light emitting areas arranged in fine pitch and that can thus be fit for the light source of high-resolution display.

According to an embodiment of the invention, a light emitting device defined by [1] to [6] below can be provided.

[1] A light emitting device, comprising:
a plurality of light emitting elements that are arranged on a substrate in lines and individually emit light each other;
a single continuous n-type semiconductor layer on the substrate shared by the plurality of light emitting elements;
a single continuous light emitting layer on the n-type semiconductor layer shared by the plurality of light emitting elements;
a single continuous p-type semiconductor layer on the light emitting layer shared by the plurality of light emitting elements;
a single continuous contact electrode film on the p-type semiconductor layer shared by the plurality of light emitting elements; and
a plurality of p-side bonding electrodes on the contact electrode film that are respectively used for the plurality of light emitting elements,
wherein the contact electrode film and the p-type semiconductor layer are configured so as to control current diffusion in in-plane directions thereof.

[2] The light emitting device according to [1], wherein a sheet resistance of a first area of the contact electrode film directly under the plurality of p-side bonding electrodes is lower than a sheet resistance of a second area of the contact electrode film except the first area.

[3] The light emitting device according to [2], wherein the contact electrode film comprises ITO or IZO, and wherein an oxygen concentration in the second area is higher than an oxygen concentration in the first area.

[4] The light emitting device according to any one of [1] to [3], wherein a space between the plurality of p-side bonding electrodes is not less than 0.1 µm and not more than 3 µm.

[5] A light emitting device, comprising:
a first light emitting element and a second light emitting element that are arranged on a substrate in lines and individually emits different colored light;
a single continuous n-type semiconductor layer on the substrate shared by the first light emitting element and the second light emitting element;
a single continuous first semiconductor layer on the n-type semiconductor layer shared by the first light emitting element and the second light emitting element;
a single continuous first intermediate layer on the first semiconductor layer that is shared by the first light emitting element and the second light emitting element and used as a first capping film for the first light emitting element;
a second semiconductor layer on the first intermediate layer used for the second light emitting element;
a second capping film on the second semiconductor layer used for the second light emitting element;
a single continuous p-type semiconductor layer on the first capping film and the second capping film shared by the first light emitting element and the second light emitting element;
a single continuous contact electrode film on the p-type semiconductor film shared by the first light emitting element and the second light emitting element;
a first p-side bonding electrode on the contact electrode film used for the first light emitting element; and
a second p-side bonding electrode on the contact electrode film used for the second light emitting element,
wherein a bandgap of the first intermediate layer is higher than bandgaps of the first semiconductor layer and the second semiconductor layer,
wherein the bandgap of the second semiconductor layer is lower than the bandgap of the first semiconductor layer,
wherein the p-type semiconductor layer and the contact electrode film are configured so as to control current diffusion in in-plane directions thereof,
wherein the first semiconductor layer serves as a light emitting layer by applying voltage to define a p-type semiconductor film side of the first light emitting element as anode and a n-type semiconductor layer side of the first light emitting element as cathode, and
wherein the second semiconductor layer serves as a light emitting layer by applying voltage to define a p-type semiconductor film side of the second light emitting element as anode and a n-type semiconductor layer side of the second light emitting element as cathode.

[6] The light emitting device according to [5], further comprising a third light emitting element that is arranged on the substrate in lines with the first light emitting element and the second light emitting element, and individually emits different colored light from the first light emitting element and the second light emitting element,
  wherein the n-type semiconductor layer, the first semiconductor layer, the first intermediate layer, and the second semiconductor layer are also shared by the third light emitting element as single continuous films,
  wherein a single continuous second intermediate layer that is shared by the second light emitting element and the third light emitting element, and used as the second capping film for the second light emitting element is provided on the second semiconductor layer,
  wherein a third semiconductor layer used for the third light emitting element is provided on the second intermediate layer,
  wherein a third capping film used for the third light emitting element is provided on the third semiconductor layer,
  wherein the p-type semiconductor film forms a single continuous film on the first capping film, the second capping film, the third capping film shared by the first light emitting element and the second light emitting element, and the third light emitting element,
  wherein the contact electrode film forms a single continuous film on the p-type semiconductor film shared by the first light emitting element, the second light emitting element, and the third light emitting element,
  wherein a third p-side bonding electrode used for the third light emitting element is provided on the contact electrode film,
  wherein the bandgap of the first intermediate layer is higher than bandgaps of the first semiconductor layer, the second semiconductor layer, the third semiconductor layer,
  wherein a bandgap of the second intermediate layer is higher than the bandgaps of the second semiconductor layer and the third semiconductor layer,
  wherein a bandgap of the third semiconductor layer is higher than the bandgap of the second semiconductor layer, and
  wherein the third semiconductor layer serves as a light emitting layer by applying voltage to define a p-type semiconductor film side of the third light emitting element as anode and a n-type semiconductor layer side of the third light emitting element as cathode.

Advantageous Effects of Invention

According to an embodiment of the invention, a light emitting device can be provided that has plural light emitting areas arranged in fine pitch and that can thus be fit for the light source of high-resolution display.

DESCRIPTION OF EMBODIMENTS

First Embodiment

Figure 1:
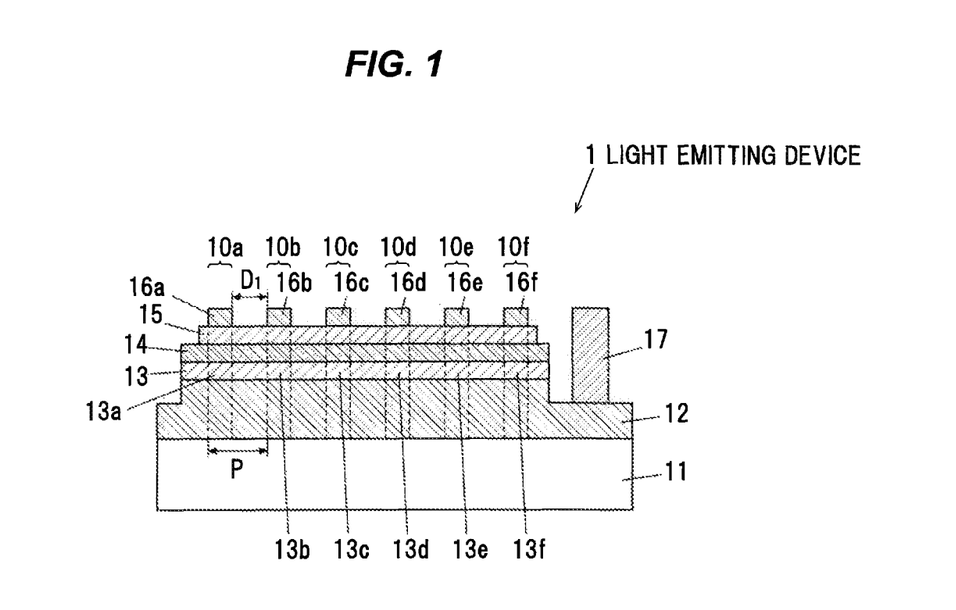
FIG. 1 is a vertical cross-sectional view showing a light emitting device according to the first embodiment of the invention.

FIG. 1 is a vertical cross-sectional view showing a light emitting device 1 according to the first embodiment of the invention. The light emitting device 1 comprises a substrate 11 such as a sapphire substrate, and a plurality of light emitting elements 10 (10a to 10f) that are arranged on the substrate 11 in lines and individually emit each other.

The light emitting device 1 further comprises a single continuous n-type semiconductor layer 12 on the substrate 11 shared by the light emitting elements 10a to 10f, a single continuous light emitting layer 13 on the n-type semiconductor layer 12 shared by the light emitting elements 10a to 10f, a single continuous p-type semiconductor layer 14 on the light emitting layer 13 shared by the light emitting elements 10a to 10f, a contact electrode film 15 on the p-type semiconductor layer 14 shared by the light emitting elements 10a to 10f, and a plurality of p-side bonding electrodes 16a to 16f on the contact electrode film 15 that are used for each of the light emitting elements 10a to 10f.

The light emitting elements 10a to 10f respectively have a structure laminating the n-type semiconductor layer 12, the light emitting layer 13, the p-type semiconductor layer 14, the contact electrode film 15, the p-side bonding electrode 16 (16a to 16f).

In the light emitting device 1, one n-side bonding electrode 17 is connected to the n-type semiconductor layer 12 shared by the light emitting elements 10a to 10f. Thus, an occupancy area of the light emitting device 1 can be reduced compared with a light emitting device which n-side bonding electrodes are connected to each of the light emitting elements 10a to 10f.

The contact electrode film 15 is configured so as to control current diffusion in in-plane directions thereof. Thus, most of current flows in a thickness direction of the contact electrode film 15 in the contact electrode film 15 directly under the p-side bonding electrodes 16a to 16f.

Similarly, the p-type semiconductor layer 14 is configured so as to control current diffusion in in-plane directions thereof. Thus, most of current flows in a thickness direction of the p-type semiconductor layer 14 in the p-type semiconductor layer 14 directly under the p-side bonding electrodes 16a to 16f.

Thus, light emitting parts 13a to 13f that are a part of the light emitting layer 13 directly under the p-side bonding electrodes 16a to 16f and are light emitting parts of the light emitting elements 10a to 10f independently emit light when applying voltage between the p-side bonding electrodes 16a to 16f and the n-side bonding electrode 17. That is, other part of the light emitting parts 13a to 13f of the light emitting layer 13 hardly emit light, or only emit light with having sufficiently small emission intensity compared with emission intensity in the light emitting parts 13a to 13f.

The contact electrode film 15 and the p-type semiconductor layer 14 have in-plane direction electric resistance enough to control current diffusion in the in-plane directions by adjusting the thickness. The electric resistance in the in-plane directions is defined by resistivity of the materials of the contact electrode film 15 and the p-type semiconductor layer 14 or the thickness of the contact electrode film 15 and the p-type semiconductor layer 14.

In the light emitting device 1, since the n-type semiconductor layer 12, the light emitting layer 13, the p-type semiconductor layer 14, and the contact electrode film 15 are shared by the light emitting elements 10a to 10f, pitch of the light emitting area can be narrowed compared with a light emitting device of which a n-type semiconductor layer, a light emitting layer, a p-type semiconductor layer, and a contact electrode to each of the individual light emitting element are individually provided.

The p-side bonding electrodes 16a to 16f are made by forming etch mask on one continuous metal film by photolithography, and removing an area where the etch mask does not cover by dry etching. Since this process using dry etching can form fine patterns compared with the other process such as the lift-off process, the distance $D_1$ between the p-side bonding electrodes 16a to 16f can be reduced (e.g., not less than 0.1 µm and not more than 3 µm).

Further, the pitch P between the light emitting parts 13a to 13f that are a plurality of individual light emitting areas of the light emitting device 1 can be further reduced (e.g., not less than 1 µm and not more than 6 µm) by shortening distance between the p-side bonding electrodes 16a to 16f.

In processing the above dry etching, the contact electrode film 15 that is the continuous film serves as an etch stopper, and thus prevents removing the p-type semiconductor layer 14 under the contact electrode film 15 by over-etching. For example, when the p-side bonding electrodes 16a to 16f comprise Ti/Au and the contact electrode film 15 comprises Indium Tin Oxide (ITO) or Indium Zinc Oxide (IZO), the gas mixture of $CF_4+O_2$ is used as dry-etching gas to pattern the p-side bonding electrodes 16a to 16f. The contact electrode film 15 serves as the etch stopper since ITO and IZO has enough resistance to the gas mixture of $CF_4+O_2$.

The n-type semiconductor layer 12, the light emitting layer 13, and the p-type semiconductor layer 14 typically comprise nitride semiconductor (a group III-V semiconductor using nitride as a group V element). For example, the n-type semiconductor layer 12 and the p-type semiconductor layer 14 comprise a semiconductor represented by the formula $Al_xIn_yGa_zN$ (x+y+z=1, z>0), the light emitting layer 13 has a multiple quantum well structure comprising a well comprising $In_vGa_wN$ (v+w=1) layer and a barrier comprising a GaN Layer.

A sheet resistance of the p-type semiconductor layer 14 is preferable to be not less than 1000 ohms per square ($\Omega/\square$) to control current diffusion in the in-plane directions. Meanwhile, if the p-type semiconductor layer 14 has thickness or conductivity to ohmic contact with the contact electrode film 15, the sheet resistance of the p-type semiconductor layer 14 may be freely set in a width that can control current diffusion in the in-plane directions. For example, the sheet resistance may be not less than 10000$\Omega/\square$ or 100000$\Omega/\square$ corresponding to the pitch of the light emitting part.

For example, the contact electrode film 15 comprises ITO or IZO. A sheet resistance of the contact electrode film 15 is preferable to be not less than 1000$\Omega/\square$ to control current diffusion in the in-plane directions. Meanwhile, if the contact electrode film 15 has thickness or conductivity to ohmic contact with the p-side bonding electrodes 16a to 16f and the p-type semiconductor layer 14, the sheet resistance of the contact electrode film 15 may be freely set in a width that can control current diffusion in the in-plane directions. For example, the sheet resistance may be not less than 10000$\Omega/\square$ or 100000$\Omega/\square$ corresponding to the pitch of the light emitting part. For example, the p-side bonding electrodes 16a to 16f comprises Ti/Au, Ta/Au. Cr/Au, Ni/Au and so on. For example, the n-side bonding electrode 17 comprises Ti/Au.

For example, thickness of the n-type semiconductor layer 12 is 1 to 10 µm. For example, thickness of the light emitting layer 13 is 10 to 100 µm. For example, thickness of the p-type semiconductor layer 14 is 10 to 100 µm. For example, thickness of the contact electrode film 15 is 5 to 100 µm.

Although FIG. 1 suggests the light emitting elements 10a to 10f as the plurality of light emitting elements 10, a number of the plurality of light emitting elements 10 included in the light emitting device 1 is not limited thereof.

(Variation)

Figure 2:
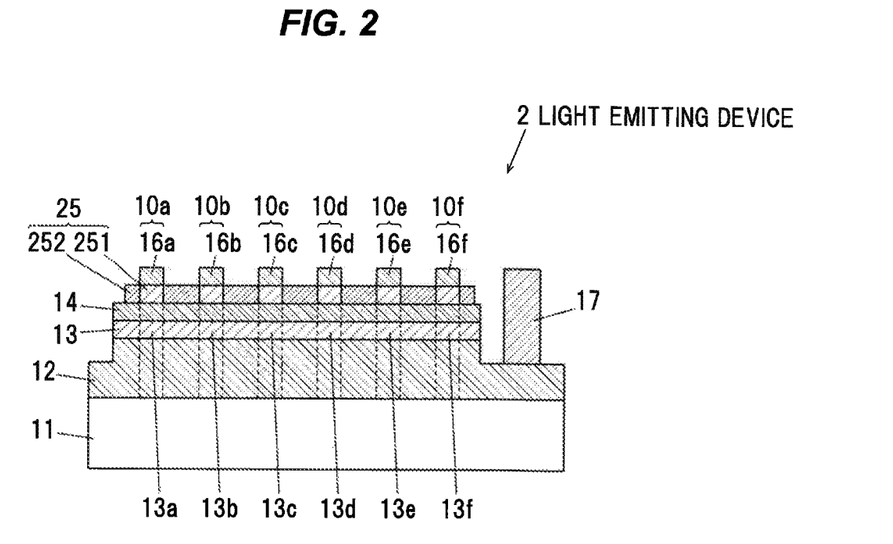
FIG. 2 is a vertical cross-sectional view showing a light emitting device according to the variation of the first embodiment of the invention.

FIG. 2 is a vertical cross-sectional view showing a light emitting device 2 that is the variation of the light emitting device 1 according to first embodiment of the invention. The light emitting device 2 is different from the light emitting device 1 in the structure of the contact electrode film.

The light emitting device 2 comprises a contact electrode film 25 instead of the contact electrode film 15 of the light emitting device 1. In the contact electrode film 25, a sheet resistance in an area 251 directly under the p-side bonding electrodes 16a to 16f is lower than a sheet resistance in the other area 252 of the area 251.

For example, the sheet resistance in the area 251 is not more than 1000$\Omega/\square$. For example, the sheet resistance in the area 252 is not more than 10000$\Omega/\square$. Further, although there is no problem in having small sheet resistance in the area 251 since current diffusion in the in-plane directions from the area 251 can be controlled by the area 252, for example, the sheet resistance in the area 251 is set at approximately not less than 100$\Omega/\square$ when the contact electrode film 25 comprises ITO or IZO. In addition, for example, the sheet resistance in the area 252 can be set at not less than 100000$\Omega/\square$ when the area 252 is formed by oxygen plasma processing described as follows.

Thus, current diffusion in the in-plan direction from the area 251 directly under the p-side bonding electrodes 16a to 16f to the other area 252 is effectively controlled and it is possible to further increase a ratio of emission intensity of the other part of the light emitting parts 13a to 13f of the light emitting layer 13 to the light emitting parts 13a to 13f.

For example in the light emitting device 1, the contact electrode film 25 can be formed by processing oxygen plasma treatment or annealing treatment in oxygen atmosphere to the contact electrode film 15 comprising ITO or IZO with using the p-side bonding electrodes 16a to 16f as mask. In this case, the area 252 includes excess oxygen by processing the oxygen plasma treatment or the annealing treatment in oxygen atmosphere. Carrier concentration decreases since free electron is trapped by excess oxygen. Thus, the electric resistance in the area 252 is higher than the electric resistance in the area 251 not treating the oxygen plasma treatment. That is, in the contact electrode film 15 comprising ITO or IZO, since oxygen concentration in the area 252 is higher than oxygen concentration in the area 251, the electric resistance in the area 252 is higher than the electric resistance in the area 251.

Effect of the First Embodiment

From the light emitting devices 1, 2 according to the above first embodiment, since the n-type semiconductor layer 12, the light emitting layer 13, the p-type semiconductor layer 14, and the contact electrode film 15 are shared by the light emitting elements 10a to 10f, the pitch P of the emission area can be narrowed. Thus, the light emitting devices 1, 2 can be fit for a light source of high-resolution display and so on.

Second Embodiment

Figure 3:
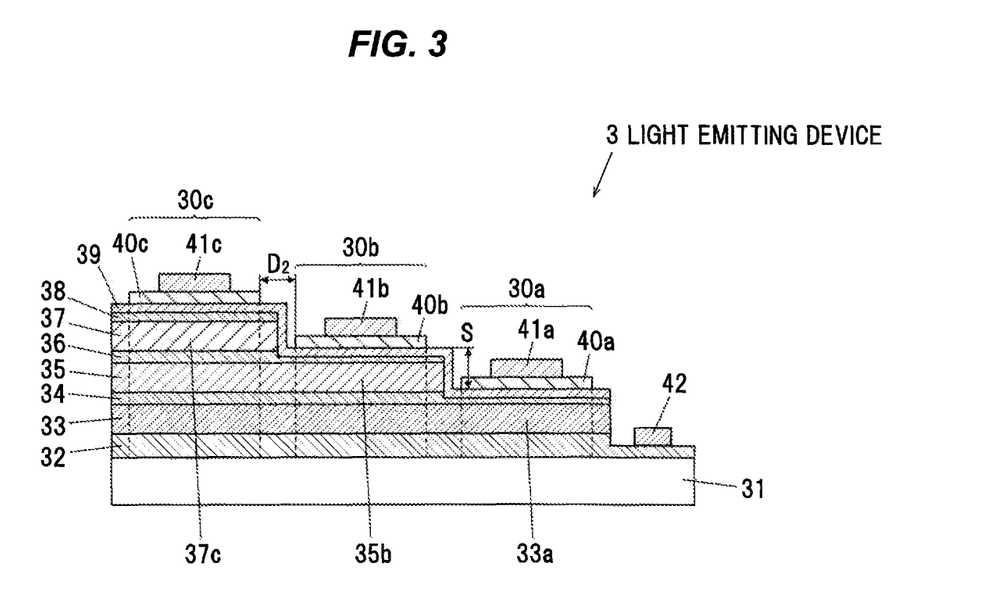
FIG. 3 is a vertical cross-sectional view showing a light emitting device according to the second embodiment of the invention.

FIG. 3 is a vertical cross-sectional view showing a light emitting device 3 according to the second embodiment of the invention. The light emitting element 3 comprises a substrate 31 such as a sapphire substrate and a plurality of light emitting elements 30 (30a to 30c) arranged on the substrate 31 in lines that independently emits different colored light.

The light emitting device 3 further comprises a single continuous n-type semiconductor layer 32 on the substrate 10 shared by the light emitting elements 30a to 30c, a single continuous first semiconductor layer 33 on the n-type semiconductor layer 32 shared by the light emitting elements 30a to 30c, a single continuous first intermediate layer 34 on the first semiconductor layer 33 that is shared by the light emitting elements 30a to 30c and used as a first capping film for the light emitting element 30a, a single continuous second semiconductor layer 35 on the first intermediate layer 34 shared by the light emitting elements 30b and 30c, a single continuous second intermediate layer 36 on the second semiconductor layer 35 that is shared by the light emitting elements 30b and 30c and used as a second capping film for the light emitting element 30b, a third semiconductor layer 37 on the second intermediate layer 36 shared by the light emitting element 30c, a third capping film 38 on the third semiconductor layer 37 that is used for the light emitting element 30c, a single continuous p-type semiconductor film 39 on the first capping film, the second capping film, and the third capping film 38 shared by the light emitting elements 30a to 30c, a contact electrode film 40a on the p-type semiconductor film 39 used for the light emitting element 30a, a contact electrode 40b on the p-type semiconductor film 39 used for the light emitting element 30b, a contact electrode film 40c on the p-type semiconductor film 39 used for the light emitting element 30c, a p-side bonding electrode 41a on the contact electrode film 40a used for the light emitting element 30a, a p-side bonding electrode 41b on the contact electrode film 40b used for the light emitting element 30b, and a p-side bonding electrode 41c on the contact electrode film 40c used for the light emitting element 30c.

The light emitting element 30a has a structure laminating the n-type semiconductor layer 32, the first semiconductor layer 33, the first intermediate layer 34, the p-type semiconductor film 39, the contact electrode film 40a, and the p-side bonding electrode 41a.

The light emitting element 30b has a structure laminating the n-type semiconductor layer 32, the first semiconductor layer 33, the first intermediate layer 34, the second semiconductor layer 35, the second intermediate layer 36, the p-type semiconductor film 39, the contact electrode film 40b, and the p-side bonding electrode 41b.

The light emitting element 30c has a structure laminating the n-type semiconductor layer 32, the first semiconductor layer 33, the first intermediate layer 34, the second semiconductor layer 35, the second intermediate layer 36, the third semiconductor layer 37, the capping film 38, the p-type semiconductor film 39, the contact electrode film 40c, and the p-side bonding electrode 41c.

The n-side bonding electrode 42 is connected on the single continuous n-type semiconductor layer 32 shared by the light emitting elements 30a to 30c.

Bandgap of the first intermediate layer 34 is higher than bandgaps of the first semiconductor layer 33, the second semiconductor layer 35, and third semiconductor layer 37. Bandgap of the second intermediate layer 36 is higher than bandgaps of the second semiconductor layer 35 and third semiconductor layer 37. Further, bandgap of the capping film 38 is higher than bandgap of the third semiconductor layer 37.

The first semiconductor layer 33, the second semiconductor layer 35, and the third semiconductor layer 37 may have Multi Quantum Well (MQW) structure. In this case, bandgaps of wells included in the MQW are defined as the bandgaps of the first semiconductor layer 33, the second semiconductor layer 35, and the third semiconductor layer 37.

In general, since the MQW structure has efficiency higher than a single quantum well structure, the first semiconductor layer 33, the second semiconductor layer 35, the third semiconductor layer 37 are preferable to have the MQW structure. Meanwhile, since the single quantum well structure has response speed (time from voltage applying to light emitting) higher than the MQW structure, one of the MQW structure or the single quantum well structure can be fit corresponding to purpose.

The bandgap of the second semiconductor layer 35 is lower than the bandgap of the first semiconductor layer 33. The bandgap of the third semiconductor layer 37 is lower than the bandgap of the second semiconductor layer 35.

As with the p-type semiconductor layer 14 of the light emitting device 1, the p-type semiconductor film 39 is configured so as to control current diffusion in in-plane directions thereof. Thus, most of current flows in a thickness direction of the p-type semiconductor film 39 in the p-type semiconductor film 39 directly under the contact electrode films 40a to 40c.

In the light emitting element 30a, a part 33a of the first semiconductor layer 33 directly under the contact electrode film 40a serves as a light emitting layer and emits light by applying voltage between the n-side bonding electrode 42 and the p-side bonding electrode 41a to define a p-type semiconductor film 39 side of the light emitting element 30a as anode and a n-type semiconductor layer 32 side of the light emitting element 30a as cathode.

In the light emitting element 30b, a part 35b of the second semiconductor layer 35 directly under the contact electrode film 40b serves as a light emitting layer and emits light by applying voltage between the n-side bonding electrode 42 and the p-side bonding electrode 41b to define a p-type semiconductor film 39 side of the light emitting element 30b as anode and a n-type semiconductor layer 32 side of the light emitting element 30b as cathode.

In the light emitting element 30c, a part 37c of the third semiconductor layer 37 directly under the contact electrode film 40c serves as a light emitting layer and emits by applying voltage between the n-side bonding electrode 42 and the p-side bonding electrode 41c to define a p-type semiconductor film 39 side of the light emitting element 30c as anode and a n-type semiconductor layer 32 side of the light emitting element 30c as cathode.

In the light emitting device 3, as described above, the n-type semiconductor layer 32, the first semiconductor layer 33, the first intermediate layer 34, and the p-type semiconductor film 39 that are respectively single continuous films are shared by the light emitting elements 30a to 30c. Further, the second semiconductor layer 35 and the second intermediate layer 36 that are respectively single continuous films are shared by the light emitting elements 30b to 30c. Thus, pitch of the light emitting area can be narrowed compared with a light emitting device of which individual light emitting elements are separated and provided.

a space in a horizontal direction between the contact electrode film 40a and the contact electrode film 40b, and a space in a horizontal direction between the contact electrode film 40b and the contact electrode film 40c, i.e., a space in a horizontal direction between the part 33a of the first semiconductor layer 33 that is the light emitting layer of the light emitting element 30a and the part 35b of the second semiconductor layer 35 that is the light emitting layer of the light emitting element 30b, and a space D2 in a horizontal direction between the part 35b of the second semiconductor layer 35 that is the light emitting layer of the light emitting element 30b and the part 37c of the third semiconductor layer 37 that is the light emitting layer of the light emitting element 30c is e.g., not less than 1 µm and not more than 3 µm.

Further, in the manufacturing process of the light emitting device 3, the capping film 38 and the third semiconductor layer 37 where the light emitting element 30a and the light emitting element 30b are provided are removed by etching, the second intermediate layer 36 and the second semiconductor layer 35 where the light emitting element 30a is provided are removed by etching. Thus, the light emitting element 30a, the light emitting element 30b, and the light emitting element 30c have different stepped height.

For example, the stepped height S between the light emitting elements (the difference in height of surface of the p-type semiconductor films between the light emitting element 30a and the light emitting element 30b, or the light emitting element 30b and the light emitting element 30c) is 0.01 to 1 µm. Further, the stepped height S between the light emitting elements is, understandably, lower than a groove depth between light emitting elements when each of the light emitting elements are separated and provided.

The first intermediate layer 34 serves as an etch stopper in removing the second semiconductor layer 35 where the light emitting element 30a is provided by etching process such as Reactive Ion Etching (RIE). Further, the second intermediate layer 36 serves as an etch stopper in removing the third semiconductor layer 37 where the light emitting element 30b is provided by etching process such as RIE. To surely serve the first intermediate layer 34 and the second intermediate layer 36 as etch stopper, the thickness of the first intermediate layer 34 is preferable to be not less than one third of the thickness of the second semiconductor layer 35, and the thickness of the second intermediate layer 36 is preferable to be not less than one third of the thickness of the third semiconductor layer 37.

The n-type semiconductor layer 32 comprises a n-type semiconductor including donor. The p-type semiconductor film 39 comprises a p-type semiconductor including acceptor.

Although the first semiconductor layer 33, the first intermediate layer 34, the second semiconductor layer 35, the second intermediate layer 36, the third semiconductor layer 37, and the capping film 38 comprise an undoped semiconductor (not including intentionally doped dopant) or n-type semiconductor, it is preferable to comprise the undoped semiconductor to control effect on emission property caused by spread dopant.

The n-type semiconductor layer 32, the first semiconductor layer 33, the first intermediate layer 34, the second semiconductor layer 35, the second intermediate layer 36, the third semiconductor layer 37, the capping film 38, and the p-type semiconductor film 39 typically comprise a nitride semiconductor (a group III-V semiconductor using nitride as a group V element).

For example, the n-type semiconductor layer 32, the first intermediate layer 34, the second intermediate layer 36, the capping film 38, and the p-type semiconductor film 39, comprise a semiconductor represented by the formula $Al_xIn_yGa_zN$ (x+y+z=1, z>0). The first semiconductor layer 33, the second semiconductor layer 35, and the third semiconductor layer 37 have a MQW structure comprising a well comprising $In_vGa_wN$ (v+w=1) layer and a barrier comprising a GaN Layer. Indium composition ratio v of the second semiconductor layer 35 is higher than Indium composition ratio v of the first semiconductor layer 33. Indium composition ratio v of the third semiconductor layer 37 is higher than Indium composition ratio v of the second semiconductor layer 35.

Light emitting colors of the light emitting element 30a, the light emitting element 30b, and the light emitting element 30c are typically blue, green, and red respectively. In the present embodiment, color of light having a wavelength of 430 to 480 nm is defined as blue, color of light having a wavelength of 500 to 550 nm is defined as green, and color of light having a wavelength of 600 to 680 nm is defined as red.

For example, the first semiconductor layer 33 to emit blue light in the light emitting element 30a has a MQW structure comprising a well comprising $In_vGa_wN$ (v+w=1, 0.14≤v≤0.33) layer and a barrier comprising a GaN layer. For example, the second semiconductor layer 35 to emit green light in the light emitting element 30b has a MQW structure comprising a well comprising $In_vGa_wN$ (v+w=1, 0.26≤v≤0.33) layer and a barrier comprising a GaN layer. For example, the third semiconductor layer 37 to emit red light in the light emitting element 30c has a MQW structure comprising a well comprising $In_vGa_wN$ (v+w=1, 0.39≤v≤0.48) layer and a barrier comprising a GaN layer.

For example, the thickness of the n-type semiconductor layer 32 in each of the light emitting parts are 1 to 5 µm. For example, the thickness of the first semiconductor layer 33, the second semiconductor layer 35, and the third semiconductor layer 37 are 6 to 100 nm. For example, the thickness of the first intermediate layer 34 and the second intermediate layer 36 are 2 to 100 nm. For example, the thickness of the capping film 38 is 5 to 10 nm. For example, the thickness of the p-type semiconductor film 39 is 10 to 200 nm.

A sheet resistance of the p-type semiconductor film 39 is preferable to be not less than 1000Ω/□ to control current diffusion in the in-plane directions. Meanwhile, if the p-type semiconductor film 39 has thickness or conductivity to ohmic contact with the contact electrode films 40a to 40c, the sheet resistance of the p-type semiconductor film 39 may be freely set in a width that can control current diffusion in the in-plane directions. For example, the sheet resistance may be not less than 10000Ω/□ or 100000Ω/□ corresponding to the pitch of the light emitting part.

For example, the contact electrode films 40a to 40c comprise ITO or IZO. For example, the p-side bonding electrodes 41a to 41c comprise Ti/Au. For example, the n-side bonding electrode 42 comprises the laminate structure comprising Ti/Al.

Figure 4:
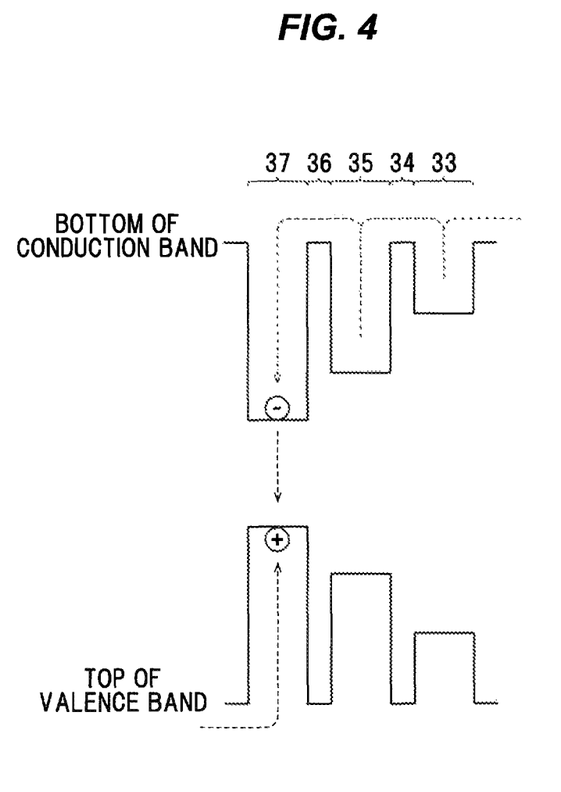
FIG. 4 is a schematic view showing a band structure of the light emitting element according to the second embodiment of the invention.

FIG. 4 is a schematic view showing a band structure of a light emitting element 30c. Estimated emission mechanism of the light emitting element 30c will be explained by using this schematic view. Although the first semiconductor layer 33, the second semiconductor layer 35, the third semiconductor layer 37 typically have the MQW structure, FIG. 4 describes as each of the first semiconductor layer 33, the second semiconductor layer 35, the third semiconductor layer 37 have the same bandgaps.

In the light emitting element 30c, an electron is injected into a laminated structure from the n-side bonding electrode 42 and a hole is injected into the laminated structure from the p-side bonding electrode 41c by applying voltage between the n-side bonding electrode 42 and the p-side bonding electrode 41c to define a p-type semiconductor film 39 side of the light emitting element 30c as anode and a n-type semiconductor layer 32 side of the light emitting element 30c as cathode.

The hole injected from the p-side bonding electrode 41c and entered into the third semiconductor layer 37 mostly stays in the third semiconductor layer 37 because barrier height of the second intermediate layer 36 viewed from the third semiconductor layer 37 is high and thus the hole hardly pass the barrier.

Meanwhile, an electron injected from the n-side bonding electrode 42 and entered into the first semiconductor layer 33 can comparatively move easily to the third semiconductor layer 37 because barrier height of the first intermediate layer 34 viewed from the first semiconductor layer 33 and barrier height of the second intermediate layer 36 viewed from the second semiconductor layer 35 are lower than the barrier height of the second intermediate layer 36 viewed from the third semiconductor layer 37, and electron mobility is higher than hole mobility.

As the reasons described above, an electron and a hole are recombined and emits light in the third semiconductor layer 37 that is the nearest semiconductor layer to the p-side bonding electrode 41c from the first semiconductor layer 33, the second semiconductor layer 35, and the third semiconductor layer 37.

Further, in the light emitting element 30b, as with the reasons according to the light emitting element 30c, an electron and a hole are recombined and emit light in the second semiconductor layer 35 that is the nearest semiconductor layer to the p-side bonding electrode 41b from the first semiconductor layer 33, and the second semiconductor layer 35.

The bandgap of the second intermediate layer 36 is preferable to be lower than the bandgap of the first intermediate layer 34. Thus, an electron is more effectively injected into the third semiconductor layer 37. Meanwhile, even if the bandgap of second intermediate layer 36 is lower than the bandgap of the first intermediate layer 34, a hole in the third semiconductor layer 37 hardly pass the barrier of second intermediate layer 36 and move to the second semiconductor layer 35 when the bandgap of the second intermediate layer 36 is approximately higher than the bandgap of the first semiconductor layer 33.

(Variation 1)

Figure 5:
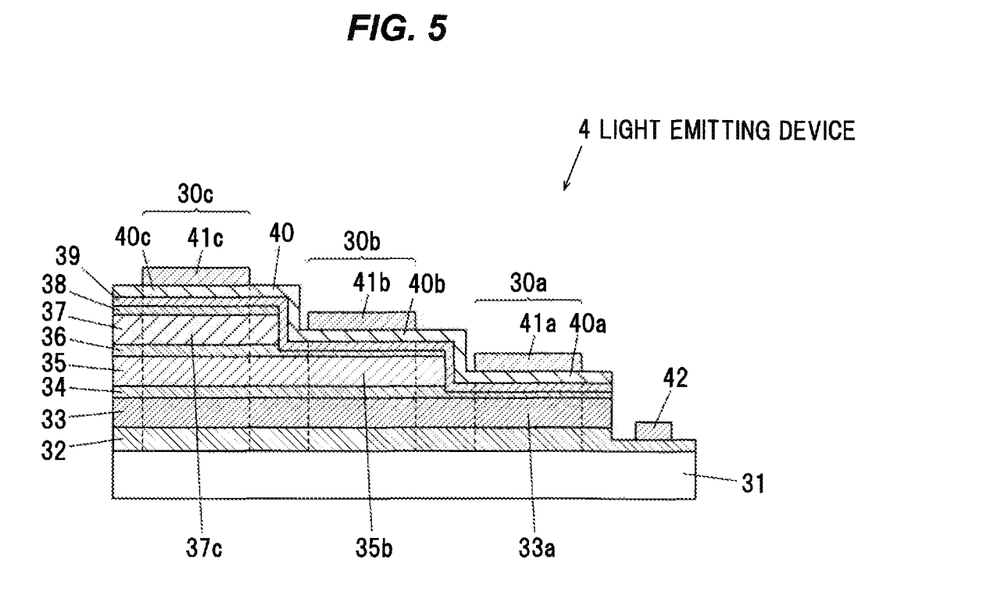
FIG. 5 is a vertical cross-sectional view showing a light emitting device according to the variation of the second embodiment of the invention.

FIG. 5 is a vertical cross-sectional view showing a light emitting device 4 that is the variation of light emitting device 3 according to the second embodiment of the invention. The light emitting device 4 is different from the light emitting device 3 in which contact electrode film of each light emitting element is a single continuous film.

The contact electrode film 40a of the light emitting element 30a of the light emitting device 4, the contact electrode film 40b of the light emitting element 30b of the light emitting device 4, and the contact electrode film 40c of the light emitting element 30c of the light emitting device 4 are the single continuous electrode film 40.

As with the contact electrode film 15 of the light emitting device 1, the electrode film 40 is configured so as to control current diffusion in in-plane directions thereof. Thus, most of current flows in a thickness direction of the contact electrode film 40 in the contact electrode film 40 directly under the contact electrode films 40a to 40c.

The electrode film 40 serves as an etch stopper in patterning the p-side bonding electrodes 41a to 41c by dry etching and it prevents removing the p-type semiconductor film 39 under the electrode film 40 by over-etching. For example, when the p-side bonding electrodes 41a to 41c comprise Ti/Au, and the electrode film 40 (the contact electrode films 40a to 40c) comprises ITO or IZO, the gas mixture of $CF_4+O_2$ is used as dry-etching gas to pattern the p-side bonding electrodes 41a to 41c, and the electrode film 40 serves as the etch stopper since ITO and IZO has enough resistance to the mixture gas of $CF_4+O_2$.

Thus, in the light emitting device 4 comprising the electrode film 40, the p-side bonding electrodes 41a to 41c can be patterned by dry-etching process such as RIE. Therefore, the space between the p-side bonding electrodes 41a to 41c can be narrowed.

A sheet resistance of the electrode film 40 is preferable to be not less than 1000Ω/□ to control current diffusion in the in-plane directions. Meanwhile, if the electrode film 40 has thickness or conductivity to ohmic contact with the contact electrode films 41a to 41c and the p-side semiconductor film 39, the sheet resistance of the p-type semiconductor film 39 may be freely set in a width that can control current diffusion in the in-plane directions. For example, the sheet resistance may be not less than 10000Ω/□ or 100000Ω/□ corresponding to the pitch of the light emitting part.

(Variation 2)

Figure 6:
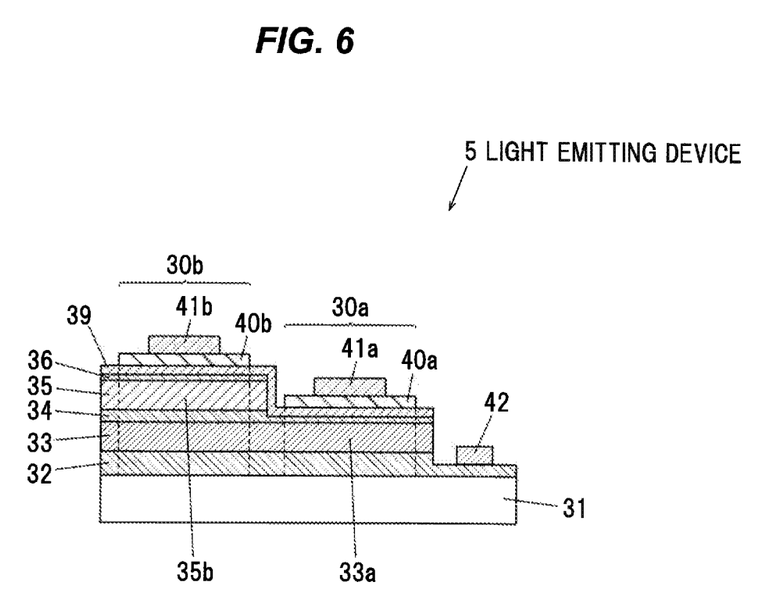
FIG. 6 is a vertical cross-sectional view showing a light emitting device according to the other variation of the second embodiment of the invention.

FIG. 6 is a vertical cross-sectional view showing the light emitting device 5 that is the other variation of the light emitting device 3 according to the second embodiment of the invention. The light emitting device 5 is different from the light emitting device 3 in comprising two light emitting elements 30a, 30b.

The light emitting device 5 comprises a substrate 31, a light emitting element 30a and a light emitting element 30b that are arranged on the substrate 31 in lines and individually emits different colored light. For example, the emitting color of the light emitting element 30a is a color having a wavelength of blue or from blue to green. For example, the emitting color of the light emitting element 30b is a color having a wavelength of red or from red to green (e.g., yellow).

The light emitting device 3 further comprises a single continuous n-type semiconductor layer 32 on the substrate 10 shared by the light emitting elements 30a and 30b, a single continuous first semiconductor layer 33 on the n-type semiconductor layer 32 shared by the light emitting elements 30a and 30b, a single continuous first intermediate layer 34 on the first semiconductor layer 33 that is shared by the light emitting elements 30a and 30b, and used as a first capping film for the light emitting element 30a, a second semiconductor layer 35 on the first intermediate layer 34 used for the light emitting element 30b, a second intermediate layer 36 on the second semiconductor layer 35 used as a second capping film for the light emitting element 30b, a single continuous p-type semiconductor film 39 on the first capping film and the second capping film shared by the light emitting elements 30a and 30b, a contact electrode film 40a on the p-type semiconductor film 39 used for the light emitting element 30a, a contact electrode 40b on the p-type semiconductor film 39 used for the light emitting element 30b, a p-side bonding electrode 41a on the contact electrode film 40a used for the light emitting element 30a, and a p-side bonding electrode 41b on the contact electrode film 40b used for the light emitting element 30b.

The light emitting element 30a has a structure laminating the n-type semiconductor layer 32, the first semiconductor layer 33, the first intermediate layer 34, the p-type semiconductor film 39, the contact electrode film 40a, and the p-side bonding electrode 41a.

The light emitting element 30b has a structure laminating the n-type semiconductor layer 32, the first semiconductor layer 33, the first intermediate layer 34, the second semiconductor layer 35, the second intermediate layer 36, the p-type semiconductor film 39, the contact electrode film 40b, and the p-side bonding electrode 41b.

Bandgap of the first intermediate layer 34 is higher than bandgaps of the first semiconductor layer 33 and the second semiconductor layer 35. Bandgap of the capping film 38 is higher than the bandgap of the second semiconductor layer 35. Further, when the first semiconductor layer 33 and the second semiconductor layer 35 have the MQW structure, the bandgaps of wells are defined as the bandgap of first semiconductor layer 33 and the second semiconductor layer 35.

The bandgap of the second semiconductor layer 35 is lower than the bandgap of the first semiconductor layer 33.

In the light emitting element 30a, a part 33a of the first semiconductor layer 33 directly under the contact electrode film 40a serves as a light emitting layer and emits light by applying voltage between the n-side bonding electrode 42 and the p-side electrode 19 to define a p-type semiconductor film 39 side of the light emitting element 30a as anode and a n-type semiconductor layer 32 side of the light emitting element 30a as cathode.

In the light emitting element 30b, a part 35b of the second semiconductor layer 35 directly under the contact electrode film 40b serves as a light emitting layer and emits light by applying voltage between the n-side bonding electrode 42 and the p-side electrode 19 to define a p-type semiconductor film 39 side of the light emitting element 30b as anode and a n-type semiconductor layer 32 side of the light emitting element 30b as cathode.

In the light emitting device 5, as described above, the n-type semiconductor layer 32, the first semiconductor layer 33, the first intermediate layer 34, and the p-type semiconductor film 39 that are respectively single continuous films are shared by the light emitting elements 30a and 30b. Thus, pitch of the light emitting area can be narrowed compared with a light emitting device of which individual light emitting elements are arranged and separated.

As with the contact electrode film 40 of the light emitting device 4, the contact electrode film 40a of the light emitting element 30a of the light emitting device 5 and the contact electrode film 40b of the light emitting element 30b of the light emitting device 5 may be a single continuous electrode film. In this case, the single continuous electrode film has the same effect with the electrode film 40 of the light emitting device 4.

Effect of the Second Embodiment

From the light emitting devices 3 to 5 according to the second embodiment described above, since the n-type semiconductor layer 32, the first semiconductor layer 33, the first intermediate layer 34, and the p-type semiconductor film 39 are shared by the light emitting elements 30a to 30c or the light emitting elements 30a and 30b, pitch of the light emitting area can be narrowed and the light emitting devices 3 to 5 can thus be fit for the light source of high-resolution display and so on.

According to the second embodiment, the light emitting device defined by [1] to [4] below can be provided.

[1] A light emitting device, comprising:
a first light emitting element and a second light emitting element that are arranged on a substrate in lines and individually emits different colored light;
a single continuous n-type semiconductor layer on the substrate shared by the first light emitting element and the second light emitting element;
a single continuous first semiconductor layer on the n-type semiconductor layer shared by the first light emitting element and the second light emitting element;
a single continuous first intermediate layer on the first semiconductor layer that is shared by the first light emitting element and the second light emitting element and used as a first capping film for the first light emitting element;
a second semiconductor layer on the first intermediate layer used for the second light emitting element;
a second capping film on the second semiconductor layer used for the second light emitting element;
a single continuous p-type semiconductor layer on the first capping film and the second capping film shared by the first light emitting element and the second light emitting element;
a first contact electrode film on the p-type semiconductor film used for the first light emitting element;
a second contact electrode film on the p-type semiconductor film used for the second light emitting element;
a first p-side bonding electrode on the first contact electrode film used for the first light emitting element; and
a second p-side bonding electrode on the second contact electrode film used for the second light emitting element,
wherein a bandgap of the first intermediate layer is higher than bandgaps of the first semiconductor layer and the second semiconductor layer,
wherein the bandgap of the second semiconductor layer is lower than the bandgap of the first semiconductor layer,
wherein the p-type semiconductor layer is configured so as to control current diffusion in in-plane directions thereof,
wherein the first semiconductor layer serves as a light emitting layer by applying voltage to define a p-type semiconductor film side of the first light emitting element as anode and a n-type semiconductor layer side of the first light emitting element as cathode, and
wherein the second semiconductor layer serves as a light emitting layer by applying voltage to define a p-type semiconductor film side of the second light emitting element as anode and a n-type semiconductor layer side of the second light emitting element as cathode.

[2] The light emitting device according to [1], wherein the first contact electrode film and the second contact electrode film form a single continuous film and are configured so as to control current diffusion in in-plane directions thereof.

[3] The light emitting device according to [1], further comprising a third light emitting element that is arranged on the substrate in lines with the first light emitting element and the second light emitting element, and individually emits different colored light from the first light emitting element and the second light emitting element,
wherein the n-type semiconductor layer, the first semiconductor layer, the first intermediate layer, and the second semiconductor layer are also shared by the third light emitting element as single continuous films, wherein a single continuous second intermediate layer that is shared by the second light emitting element and the third light emitting element, and used as the second capping film for the second light emitting element is provided on the second semiconductor layer, wherein a third semiconductor layer used for the third light emitting element is provided on the second intermediate layer, wherein a third capping film used for the third light emitting element is provided on the third semiconductor layer, wherein the p-type semiconductor film forms a single continuous film on the first capping film, the second capping film, and the third capping film shared by the first light emitting element and the second light emitting element, and the third light emitting element, wherein a third contact electrode film used for the third light emitting element is provided on the p-type semiconductor film, wherein a third p-side bonding electrode used for the third light emitting element is provided on the third contact electrode film, wherein the bandgap of the first intermediate layer is higher than bandgaps of the first semiconductor layer, the second semiconductor layer, the third semiconductor layer, wherein a bandgap of the second intermediate layer is higher than the bandgaps of the second semiconductor layer and the third semiconductor layer, wherein a bandgap of the third semiconductor layer is higher than the bandgap of the second semiconductor layer, and wherein the third semiconductor layer serves as a light emitting layer by applying voltage to define a p-type semiconductor film side of the third light emitting element as anode and a n-type semiconductor layer side of the third light emitting element as cathode.

[4] The light emitting device according to [3], wherein the first contact electrode film, the second contact electrode film and the third contact electrode film form a single continuous film and are configured so as to control current diffusion in in-plane directions thereof.

Although the embodiments of the invention have been described, the invention is not intended to be limited to the embodiments and the various kinds of modifications can be implemented without departing from the gist of the invention. In addition, the constituent elements in the embodiments can be arbitrarily combined without departing from the gist of the invention.

In addition, the invention according to claims is not to be limited to the embodiments. Further, please note that all combinations of the features described in the embodiments are not necessary to solve the problem of the invention.

The invention claimed is:

1. A light emitting device, comprising:
a first light emitting element and a second light emitting element that are arranged on a substrate in lines and individually emits different colored light;
a single continuous n-type semiconductor layer on the substrate shared by the first light emitting element and the second light emitting element;
a single continuous first semiconductor layer on the n-type semiconductor layer shared by the first light emitting element and the second light emitting element;
a single continuous first intermediate layer on the first semiconductor layer that is shared by the first light emitting element and the second light emitting element and used as a first capping film for the first light emitting element;
a second semiconductor layer on the first intermediate layer of the second light emitting element;
a second capping film on the second semiconductor layer of the second light emitting element;
a single continuous p-type semiconductor film on the first capping film and the second capping film shared by the first light emitting element and the second light emitting element;
first and second contact electrode films on the p-type semiconductor film of the first light emitting element and the second light emitting element, respectively;
a first p-side bonding electrode on the first contact electrode film of the first light emitting element; and
a second p-side bonding electrode on the second contact electrode film of the second light emitting element,
wherein a bandgap of the first intermediate layer is higher than bandgaps of the first semiconductor layer and the second semiconductor layer,
wherein the bandgap of the second semiconductor layer is lower than the bandgap of the first semiconductor layer,
wherein the first semiconductor layer serves as a light emitting layer by applying voltage to define a p-type semiconductor film side of the first light emitting element as anode and a n-type semiconductor layer side of the first light emitting element as cathode, and
wherein the second semiconductor layer serves as a light emitting layer by applying voltage to define a p-type semiconductor film side of the second light emitting element as anode and a n-type semiconductor layer side of the second light emitting element as cathode.

2. The light emitting device according to claim 1, further comprising a third light emitting element that is arranged on the substrate in lines with the first light emitting element and the second light emitting element, and individually emits different colored light from the first light emitting element and the second light emitting element,
wherein the n-type semiconductor layer, the first semiconductor layer, the first intermediate layer, and the second semiconductor layer are also shared by the third light emitting element as single continuous films,
wherein a single continuous second intermediate layer that is shared by the second light emitting element and the third light emitting element, and used as the second capping film for the second light emitting element is provided on the second semiconductor layer,
wherein a third semiconductor layer of the third light emitting element is provided on the second intermediate layer,
wherein a third capping film of the third light emitting element is provided on the third semiconductor layer,
wherein the p-type semiconductor film forms the single continuous film on the first capping film, the second capping film, and the third capping film shared by the first light emitting element and the second light emitting element, and the third light emitting element,
wherein a third contact electrode film is formed on the p-type semiconductor film of the third light emitting element,
wherein a third p-side bonding electrode of the third light emitting element is provided on the third contact electrode film, wherein the bandgap of the first intermediate layer is higher than bandgaps of the first semiconductor layer, the second semiconductor layer, the third semiconductor layer,
wherein a bandgap of the second intermediate layer is higher than the bandgaps of the second semiconductor layer and the third semiconductor layer,
wherein a bandgap of the third semiconductor layer is higher than the bandgap of the second semiconductor layer, and
wherein the third semiconductor layer serves as a light emitting layer by applying voltage to define a p-type semiconductor film side of the third light emitting element as anode and a n-type semiconductor layer side of the third light emitting element as cathode.

* * * * *